United States Patent [19]

Kawasaki et al.

[11] 4,453,174

[45] Jun. 5, 1984

[54] SEMICONDUCTOR INTEGRATED CIRCUIT DEVICE WITH NON-VOLATILE SEMICONDUCTOR MEMORY CELLS AND MEANS FOR RELIEVING STRESS THEREIN

[75] Inventors: Yuichi Kawasaki, Yokohama; Sumio Tanaka, Tokyo; Hiroshi Iwahashi, Yokohama; Masamichi Asano, Tokyo; Shinichi Maekawa; Masazi Mito, both of Yokohama, all of Japan

[73] Assignee: Tokyo Shibaura Denki Kabushiki Kaisha, Japan

[21] Appl. No.: 152,292

[22] Filed: May 22, 1980

[30] Foreign Application Priority Data

May 25, 1979 [JP] Japan ............................ 54-64009

[51] Int. Cl.³ ........................................... H01L 29/02
[52] U.S. Cl. ........................................ 357/41; 357/26; 357/45; 357/55; 357/23.5
[58] Field of Search ....................... 357/41, 50, 55, 51, 357/92, 45, 26, 23

[56] References Cited

U.S. PATENT DOCUMENTS

| | | | |
|---|---|---|---|
| 3,696,274 | 10/1972 | Davis | 357/49 |
| 3,786,318 | 1/1974 | Momoi et al. | 357/49 |
| 3,825,945 | 7/1974 | Masuoka | 357/23 |
| 3,961,355 | 6/1976 | Abbas et al. | 357/49 |
| 3,969,747 | 7/1976 | Tsuyuki et al. | 357/92 |
| 3,978,577 | 9/1976 | Bhattacharyya et al. | |
| 4,122,544 | 10/1978 | McElroy | 357/41 |
| 4,163,245 | 7/1979 | Kinoshita | 357/51 |
| 4,247,788 | 1/1981 | Bluzer | 357/55 |
| 4,278,705 | 7/1981 | Agraz-Guerena et al. | 357/49 |
| 4,288,807 | 9/1981 | Enzlin et al. | 357/55 |

FOREIGN PATENT DOCUMENTS 6607320 12/1966 Netherlands .......................... 357/49

OTHER PUBLICATIONS

IBM Technical Disclosure Bulletin, vol. 20, No. 8, Jan. 1978, Charge Storage Device Fabrication, Chang, et al.
IEEE Transactions on Electron Devices, vol. ED-25, No. 8, Aug. 1978, Radiation-Hardened MNOS RAM Technology, Marraffino, et al.
Japanese Journal of Applied Physics, Supp., vol. 15, No. 7, 1976 supp. A 256 Bit Nonvolatile Static Random Access Memory with MNOS Memory Transistors, Saito, et al.
IBM Technical Disclosure Bulletin, vol. 16, No. 4, Sep. 1973, Simultaneously Forming Memory and Support Circuits Using FETS, Anantha.
Japanese Journal of Applied Physics, vol. 13, No. 9, Sep. 1974, Circuit Array and System of MAOS Type Fully Decoded Electrically Alterable Read Only Memory-Ic, Yamaguchi et al.

*Primary Examiner*—Joseph E. Clawson, Jr.
*Attorney, Agent, or Firm*—Finnegan, Henderson, Farabow, Garrett & Dunner

[57] ABSTRACT

Disclosed is a metal oxide semiconductor integrated circuit device having an array of electrically rewritable, insulated gate type non-volatile semiconductor memory cells formed on a semiconductor substrate, read/write mode setting circuit and address designating circuits arranged corresponding to the memory cell array, those circuits being fabricated on the substrate, and a field insulating layer formed on the substrate. A cut portion is formed in the field insulating layer to surround the memory cell array.

4 Claims, 5 Drawing Figures

SEMICONDUCTOR INTEGRATED CIRCUIT DEVICE WITH NON-VOLATILE SEMICONDUCTOR MEMORY CELLS AND MEANS FOR RELIEVING STRESS THEREIN

The invention relates to an integrated circuit device in which an insulated gate type non-volatile semiconductor memory cell array and peripheral circuits for the memory cell array are formed on the same substrate.

A non-volatile semiconductor memory electrically rewritable has been known as a stacked-gate avalanche-injection MOS memory, an MNOS memory and the like. The semiconductor memory of this type is easily fabricated by IC technology and is easy to use for writing, reading and erasing of information. With those useful features, the semiconductor memory has been widely used in microcomputers and the like.

In the non-volatile semiconductor memory of this type, the periphery circuits for the memory cell array such as a decoder circuit, a buffer circuit and the like, together with the memory cell array, are generally formed on the semiconductor substrate in integrated circuit fashion. In manufacturing a semiconductor device of the type in which the semiconductor memory and its peripheral circuits are fabricated on the same substrate, notable matters are to minimize inferior memories and to improve the yield of the product. A typical phenomena exhibited by inferior memories is that written information is easily lost from the memory in a relatively short time.

Accordingly, the present invention as an object to provide a semiconductor integrated circuit device with semiconductor memory cells free from the spontaneous volatilization of written information.

According to one embodiment of this invention, there is provided a semiconductor integrated circuit device with non-volatile semiconductor memory cells involving an array of electrically rewritable, insulated gate type non-volatile semiconductor memory cells formed on a substrate, a peripheral circuit section including at least part of a selection circuit for selecting the semiconductor memory cell formed on the semiconductor substrate, and a field insulating layer formed on the substrate, wherein at least one cut portion is formed in the insulating layer on the peripheral region of the semiconductor memory cell array.

Other objects and features of the invention will be apparent from the following description taken in connection with the accompanying drawings, in which.

The present invention addresses the problem of when written information spontaneously volatilizes from a memory cell storing the information. In the assembling processes of an MOS semiconductor integrated circuit device such as mounting, bonding, scribing, shaving, and sealing processes, distortion develops in the periphery of the non-volatile semiconductor memory cell array. The distortion developed distorts the gate insulating layer and gate electrodes of the memory cells of the semiconductor memory cell array, through the interfaces between a field oxide layer and a semiconductor substrate and between the field oxide layer and a passivation layer. The distortion of the gate insulating layer and gate electrode may cause carriers accumulated in the floating gate, for example, to leak. If this assumption of resulting distortion is correct, something to block the transfer of the distortion to the memory cell array must solve the problem of information volatilization. For ascertaining the correctness of the assumption, we manufactured experimental MOS semiconductor integrated circuit devices through the above-mentioned assembling processes, after a groove or long cut is formed in the field oxide layer around the memory cell array in order to block the distortion transfer. Our experiment, in which the MOS semiconductor integrated circuit devices manufactured were repetitively subjected to read and write operations, showed that little written information was volatilized from such memory cells.

Figure 1:
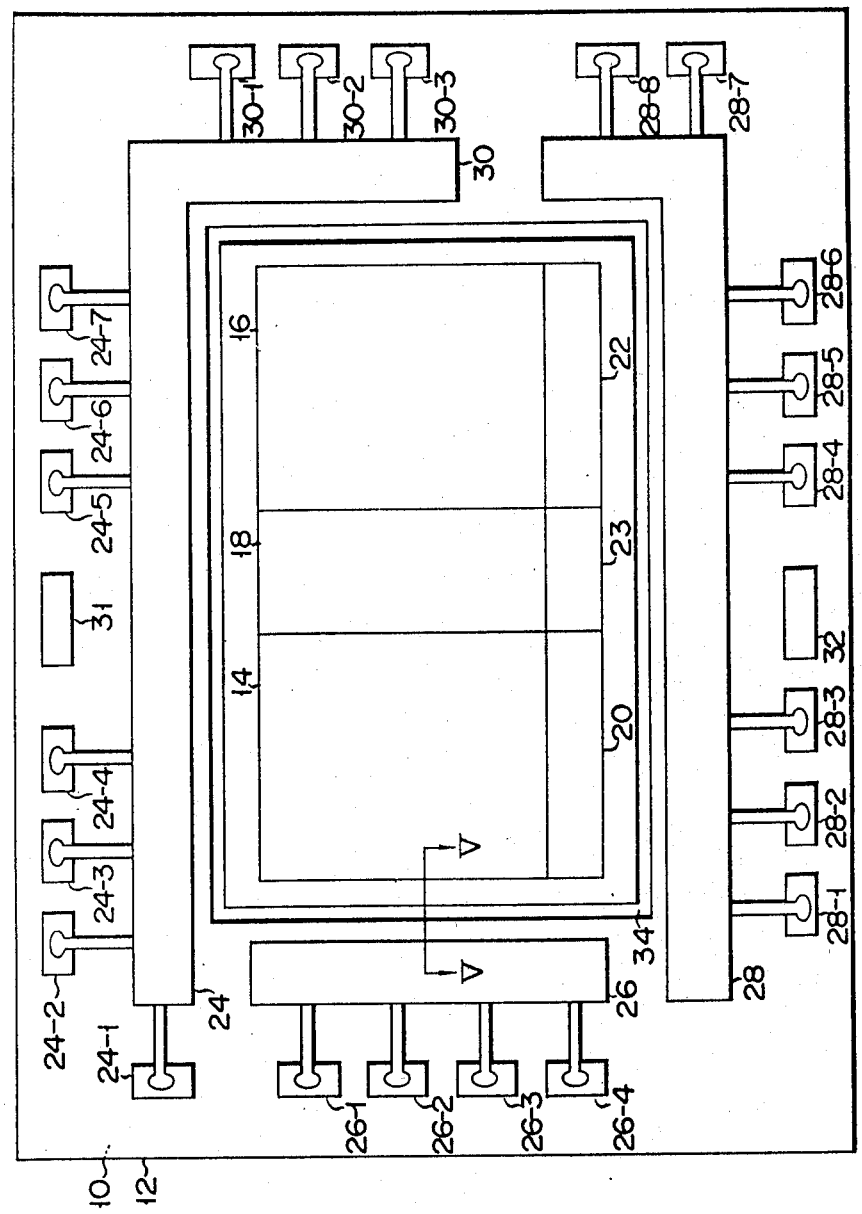
FIG. 1 shows a schematic plan view of a semiconductor integrated circuit device according to an embodiment of the invention.

FIG. 1 shows a schematic plan view of a MOS integrated circuit device according to an embodiment of the invention.

Figure 5:
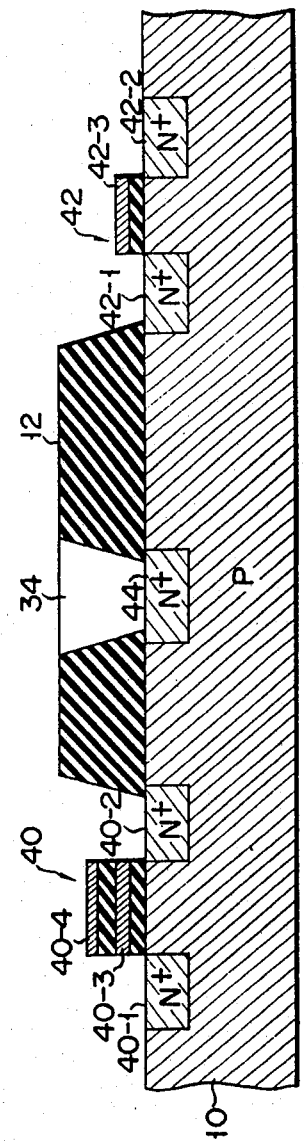
FIG. 5 is a cross-sectional view taken along line V—V in FIG. 1.

A MOS integrated circuit device as shown in FIGS. 1 and 5 is comprised of a field insulating layer 12 formed on a semiconductor substrate 10 of P type, for example. Memory cell arrays 14 and 16 each having non-volatile semiconductor memory cells are arranged in a matrix fashion on the substantial central region of the semiconductor substrate 10, and a row decoder/selection circuit 18 is formed between the memory cell arrays 14 and 16. The non-volatile semiconductor memory cells are formed after the field insulating layer 12 is selectively removed by etching, and are formed of, for example, stacked-gate avalanche-injection (SA MOS) memories in which the write operation is performed by taking advantage of impact ionization. Adjacent the row decoder/selection circuit 18 and the memory cell arrays 14 and 16 are formed a column decoder circuit 23 and column selection circuits 20 and 22.

Several circuits are disposed around the memory cell arrays 14 and 16. That is, a row address designating buffer circuit 24 is disposed above the memory cell arrays as viewed in the drawing. The row address designating buffer circuit 24 responds to a row address signal from an address signal generating circuit (not shown) to apply a row address signal to the row decoder/selection circuit 18 thereby to selectively energize rows of the memory cell arrays 14 and 16. An address designating buffer circuit 26 is disposed on the left side of the memory cell arrays and is designed to respond to a column address signal from the address signal generating circuit to apply a column address signal to the column decoder circuit 23 thereby to selectively energize columns of the memory cell arrays 14 and 16 through the column selection circuits 20 and 22. A data input/output buffer circuit 28 is disposed under the memory cell arrays and is coupled between an external data processing circuit (not shown) and column selection circuits 20 and 22 to execute data transfer between the external data processing circuit and the memory cell arrays 14 and 16. A control buffer circuit 30 is disposed on the right upper side of the arrays and coupled between the data processing circuit and the memory cell arrays 14 and 16, and is designed to respond to a control signal from the data processing circuit to control the read/write mode of memory arrays 14 and 16.

The MOS integrated circuit device further includes bonding pads arranged outside those circuits around the memory arrays. Bonding pads 24-1 to 24-7 are used for coupling the address signal generating circuit (not shown) with the row address designating circuit 24. Bonding pads 26-1 to 26-4 are used to couple the address signal generating circuit with the column address designating buffer circuit 26. Bonding pads 28-1 to 28-9 are used to couple the data processing circuit (not shown) with the data input/output buffer circuit 28. Bonding pads 30-1 to 30-3 are used to couple the data processing circuit with the control buffer circuit 30. Bonding pads 31 and 32 coupled with power source lines (not shown) are used to supply power source voltage to the memory arrays 14 and 16.

The memory cell arrays 14 and 16, the row decoder/selection circuit 18, the column selection circuits 20 and 22, the column decoder circuit 23, and the buffer circuits 24, 26, 28 and 30 are fabricated by well-known methods. The electrical interconnections among those circuits and to those bonding pads are not illustrated in detail, for simplicity of illustration.

It is noted that a long and narrow cut 34 is formed in the field insulating layer 12, surrounding the region in which the memory cell arrays 14 and 16, the row decoder/selection circuit 18, the column selection circuits 20 and 22, and the column decoder circuit 24 are formed. The cut 34 may be formed in the process for forming the various circuit regions, for example. The cut 34 may take any shape so long as it can block the distortion force developed in the peripheral portion of the memory cell arrays from being transferred to the memory cell arrays, such as notch, groove, deep recess, and through-hole.

Figure 2:
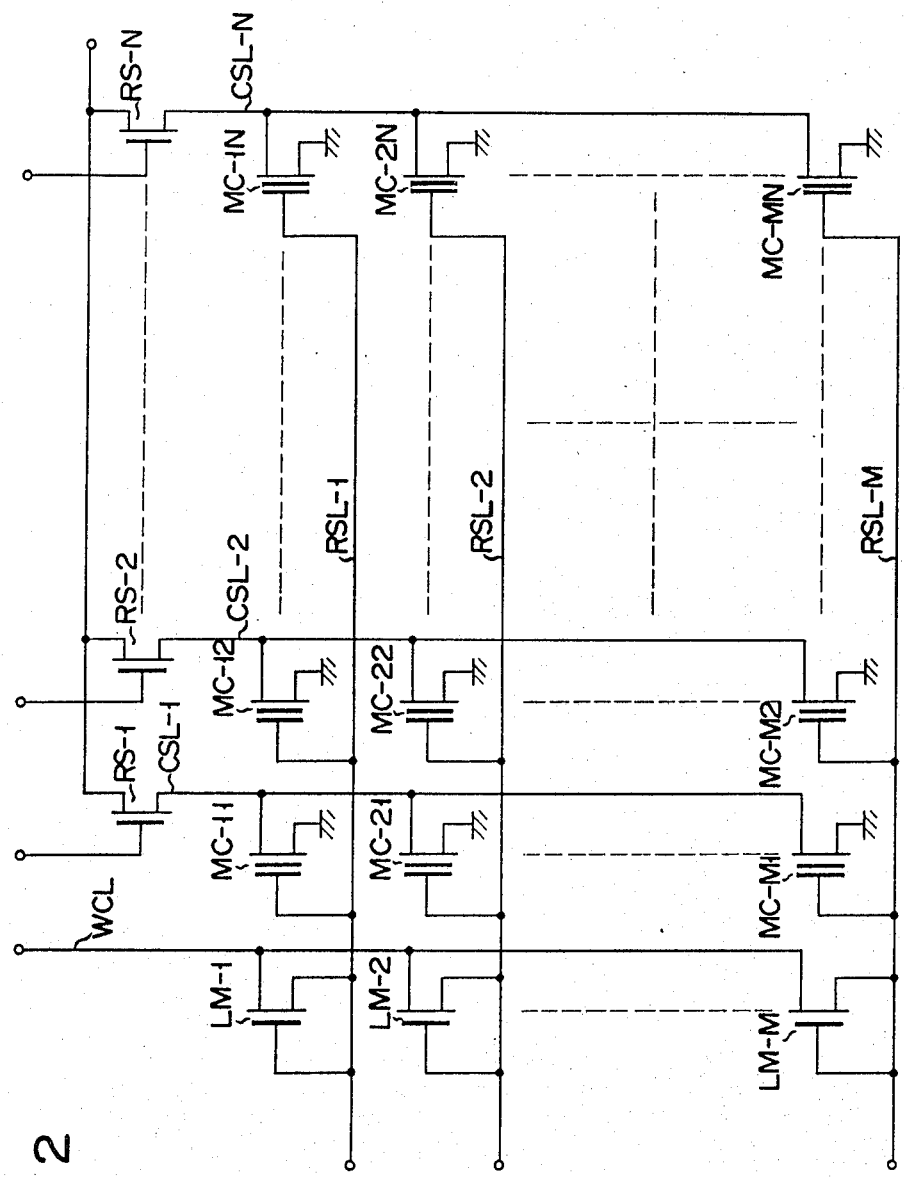
FIG. 2 is a circuit diagram of a memory cell array of the semiconductor integrated circuit device illustrated in FIG. 1.

The memory cell arrays 14 and 16 are each divided into four sections. One of the sections is illustrated in FIG. 2 in more detail.

Each section of the memory cell arrays 14 and 16 has SA MOS FETs MC-11 to MC-MN serving as memory cells arranged in a matrix fashion, and load MOS FETs LM-1 to LM-M. As shown in FIG. 2, the drains of the SA MOS FETs arranged on the same column line are commonly coupled with corresponding one of column selection lines CSL-1 to CSL-N coupled with the sources of row selection FETs RS-1 to RS-N constituting part of the column selection circuit 20 or 22 shown in FIG. 1. The sources of all of the SA MOS FETs MC-11 to MC-MN are connected to ground, for example, the bonding pad 32. The gates of the SA MOS FETs arranged on the same row lines are respectively coupled with row selection lines RSL-1 to RSL-M selectively energized by the row decoder/selection circuit 18. The selection FETs RS-1 to RS-N are connected at the drains to a power terminal, for example, the bonding pad 31, and at the gates to the output terminal of the column selection decoder 20 or 22. Both the gates and sources of the load MOS FETs LM-1 to LM-M are coupled with the row selection lines RSL-1 to RSL-M, respectively, and the drains thereof are commonly connected to the write control line WCL of the control buffer circuit 30 shown in FIG. 1. With this arrangement, low and high level voltages are applied to the gates of the SA MOS FETs MC-11 to MC-MN in accordance with the read/write mode.

Figure 3:
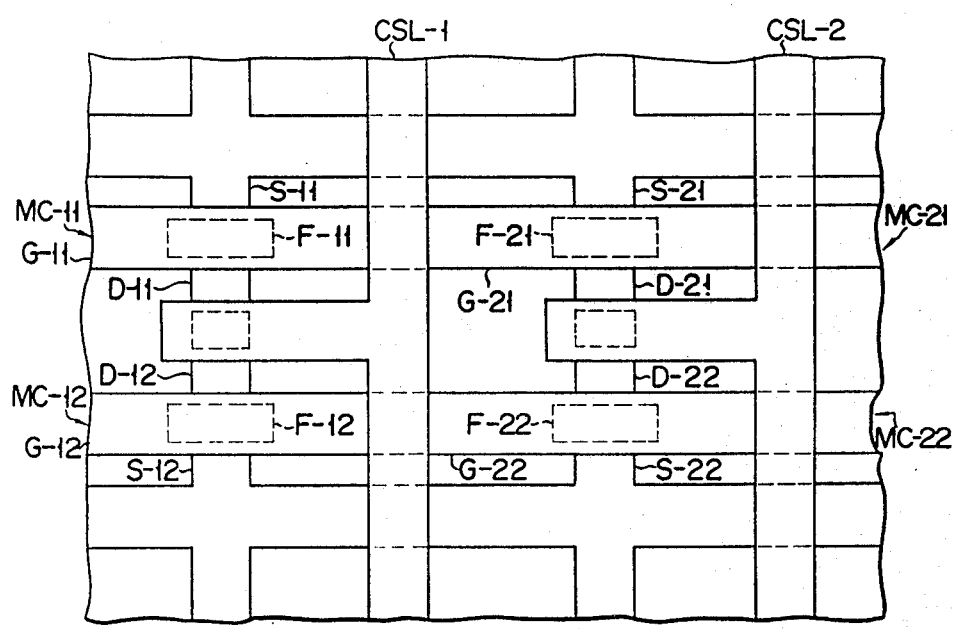
FIG. 3 is a schematic plan view of a part of the memory cell array of the semiconductor integrated circuit device shown in FIG. 1.
Figure 4:
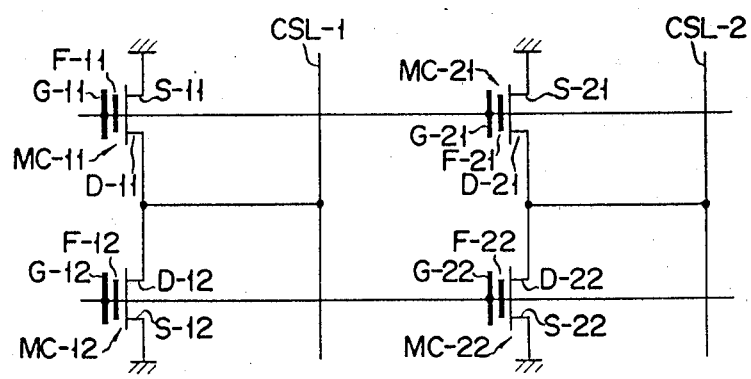
FIG. 4 is an equivalent circuit of the memory cell array shown in FIG. 3.

FIG. 3 shows a plan view of part of the memory cell arrays 14 or 16, for example, a region including memory cells MC-11 to MC-22. FIG. 4 shows an equivalent circuit of the memory cell region shown in FIG. 3. In FIG. 3, omitted for simplicity of illustration, an insulating layer for insulating the conductive layers forming the source and gate electrodes of each memory cell and the conductive layer for forming the selection line CSL from one another.

Each of the memory cells MC-11 to MC-22 is provided with a control gate electrode G, a floating gate electrode F, a drain electrode D and a source electrode S. The gate electrodes G of the memory cells on the same row are commonly connected to one another. Paired memory cells on the same column line, for example, memory cells MC-11 and MC-12, are mutually connected with each other at the drain electrodes, for example, D-11 and D-12, and to the column selection line CSL.

FIG. 5 shows a cross-sectional view of the MOS integrated circuit device taken along line V—V of FIG. 1.

In FIG. 5, an SA MOS FET 40 is one of the memory cells constituting the memory cell array 14 and an MOS FET 42 is one of the MOS FETs constituting the column address designating circuit 26. The SA MOS FET 40 is constituted by drain and source regions 40-1 and 40-2 formed in the surface region of a P conductivity type layer 10, a floating gate 40-3 which is formed between the regions 40-1 and 40-2 and is insulated from the substrate 10, and a control gate 40-4 insulatively formed on the floating gate 40-3. The MOS FET 42 includes drain and source regions 42-1 and 42-2 formed in the surface region of the substrate 10 and a gate 42-3 which is insulatively formed on the substrate 10 between the regions 42-1 and 42-2. A field insulating layer 12 is disposed between those FETs 40 and 42 to electrically separate one from another.

The field insulating layer 12 is formed on the semiconductor substrate 10 by, for example, the vapor growth method or the coplanar method. When the vapor growth method is employed, following the formation of an insulating layer over the entire surface of the substrate 10, the insulating layer at the portions corresponding to the memory cell arrays 14 and 16, the circuits 18, 20, 22, 23, 24, 26 and 28, and the cut 34 are removed by the etching. When the insulating layer 12 is formed on the substrate 10 through the thermal oxidation by using the coplanar method, before the thermal oxidation step, an oxidation resistive mask made of silicon nitride, for example, is formed in the region corresponding to the component forming region and the cut portion and then the insulating layer 12 is formed through the thermal oxidation. Finally, the mask is removed.

After this, the N+ regions 40-1, 40-2, 42-1, 42-2 and 44 are formed by the usual semiconductor technique, for example, the diffusion method or the ion implantation. Then, the gate insulating layers are formed and conductive layers 40-3 and 42-3 are further formed on the gate insulating layers. On the conductive layer 40-3, a conductive layer 40-4 is formed with interposition of an insulating layer therebetween. In this way, the semiconductor structure is formed as shown in FIG. 5. Of course, electrodes are formed to the drain and source regions, necessary wiring is performed, and a passivation layer by material such as phosphorous nitride or silicon nitride is formed on the semiconcuctor structure.

Practically, a number of the semiconductor devices as shown in FIG. 1 are formed on a wafer and are separated into individual ones by a scribing step. Then, the bonding pads are formed on each semiconductor device. In the scribing and bonding processes, distortion is developed in the peripheral region of the memory arrays 14 and 16. The distortion developed however, is blocked from being transferred to the SA MOS FETs forming the memory cell arrays 14 and 16, by means of the cut 34. Additionally, alkali ions introduced from exterior into the peripheral region may also be prevented from flowing into the region of the arrays 14 and 16. The transfer of the distortion is more reliably prevented by the N+ region 44 formed in the surface area of the substrate 10. For preventing adverse influence of the junction leak to the other components, it is preferable to keep the potentials in the N+ region 44 and the substrate 10 equal to each other.

While the present invention has been described by using the preferred embodiment, it is evident that the present invention may be modified and changed within the scope of the invention. For example, the SA MOS FETs used for the memory cell arrays 14 and 16 may be replaced by MNOS FETs.

The continuous closed loop of the cut 34 surrounding the memory arrays 14 and 16 in FIG. 1 may be replaced by a discontinuous loop or notches aligned only vertically as viewed in the drawing. The cut 34 may be formed on the insulating layer 12 on the outside of the bonding pads 24-1 to 24-7, 26-1 to 26-4, 28-1 to 28-8, 30-1 to 30-3, 31 and 32.

Further, in the embodiment described with reference to FIG. 5, the N+ type region 44 is formed in the substrate 10 in a position corresponding to the cut 34, but it is also possible to form a P+ type region in the corresponding surface area of the substrate 10 instead of the N+ type region 44. That is, in order to attain the prescribed effect, a semiconductor region having a high impurity concentration irrespective of its conductivity type may be formed in the surface area of the substrate 10 corresponding to the cut 34.

What we claim is:

1. A semiconductor integrated circuit device comprising:
   (a) a semiconductor substrate;
   (b) an array of insulated gate semiconductor memory cells formed on said substrate with said array including a peripheral circuit section, also formed on said substrate, having at least a part of a control circuit for selectively executing read/write operation of said semiconductor memory cells;
   (c) a field insulating layer formed on said semiconductor substrate and surrounding said array; and
   (d) means for blocking distortion developed during manufacturting of said device peripherally to said array from being transferred to said array of insulated gate semiconductor memory cells, wherein said means for blocking is a groove passing through said field insulating layer substantially to the surface of said substrate and substantially surrounding said array of insulated gate semiconductor memory cells.

2. A semiconductor integrated circuit device according to claim 1, wherein said semiconductor memory cells are made of stacked-gate avalanche-injection metal oxide semiconductor.

3. A semiconductor integrated circuit device according to claim 1, further comprising a semiconductor region which is formed in the surface area of said semiconductor substrate below said groove and has a higher impurity concentration than that of said semiconductor substrate.

4. A semiconductor integrated circuit device according to claim 3, wherein said semiconductor memory cells are made of stacked-gate avalanche-injection metal oxide semiconductor.

* * * * *